United States Patent [19]

Naoi

[11] 4,331,038
[45] May 25, 1982

[54] PUSH-BUTTON TYPE TUNER APPARATUS
[75] Inventor: Mitsuaki Naoi, Tokyo, Japan
[73] Assignee: Mitsumi Electric Co., Ltd., Tokyo, Japan
[21] Appl. No.: 118,766
[22] Filed: Feb. 5, 1980
[51] Int. Cl.³ ............................................. H03J 5/12
[52] U.S. Cl. ...................................... 74/10.33; 334/7
[58] Field of Search ........................... 74/10.33; 334/7

[56]  References Cited
U.S. PATENT DOCUMENTS

| 2,310,003 | 2/1943 | Wells | 74/10.33 |
| 4,133,214 | 1/1979 | Cicala | 74/10.33 |
| 4,189,949 | 2/1980 | Righi et al. | 334/7 |
| 4,231,263 | 11/1980 | Antonello | 74/10.33 |
| 4,279,170 | 7/1981 | Righi et al. | 74/10.33 |

Primary Examiner—Allan D. Herrmann
Attorney, Agent, or Firm—Michael N. Meller; Anthony H. Handal

[57] ABSTRACT

A push-button type tuner apparatus comprises a slide cam member having a plurality of V-shaped cam parts formed therein and supported slidably in the transverse direction on a frame structure, and a plurality of manually operated structure supported slidably backwards and forwards on the frame structure. Each manually operated structure is provided with a memory member for restricting the position of the slide cam member when engaged with an associated V-shaped cam part thereof, a clamp member for supporting the memory member in a clampable manner, and a clamp cam member supported to slide with respect to the clamp member and for causing the clamp member to undergo clamping operation responsive to slide motion of the clamp cam member. The clamp member is of two-arm structure and has a pair of arms with a slot therebetween and a support part for supporting the memory member at a rear part of the slot, at least one arm undergoing rotational displacement to approach and separate from the other arm to clamp the memory member. The clamp cam member is disposed to confront the pair of arms of the clamp member and to be brought into contact with the pair of arms to cause at least one arm to undergo rotational displacement responsive to slide motion of the clamp cam member.

13 Claims, 28 Drawing Figures

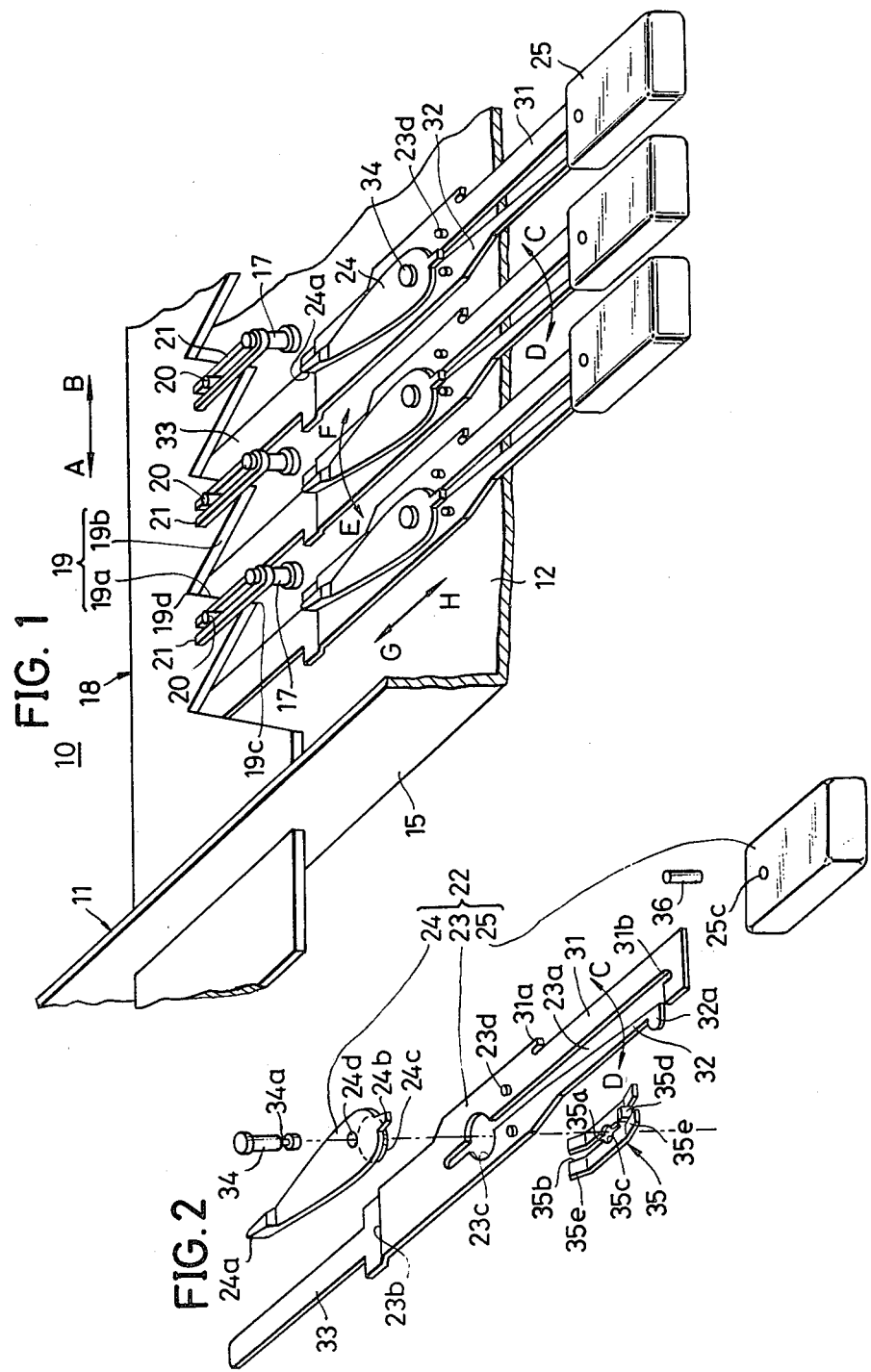

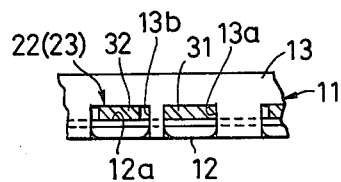
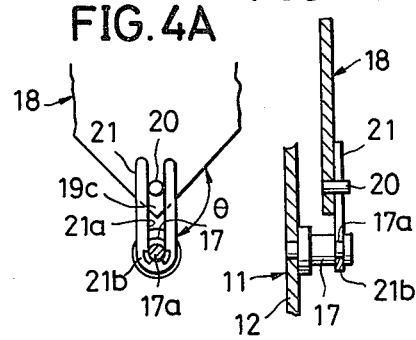
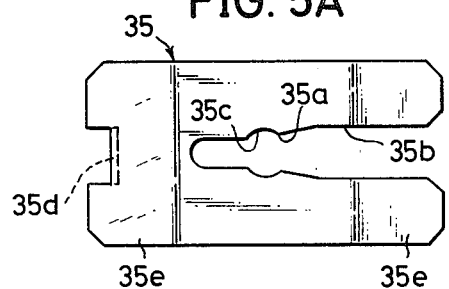
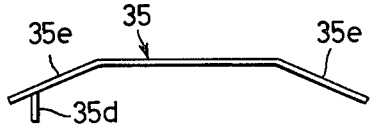
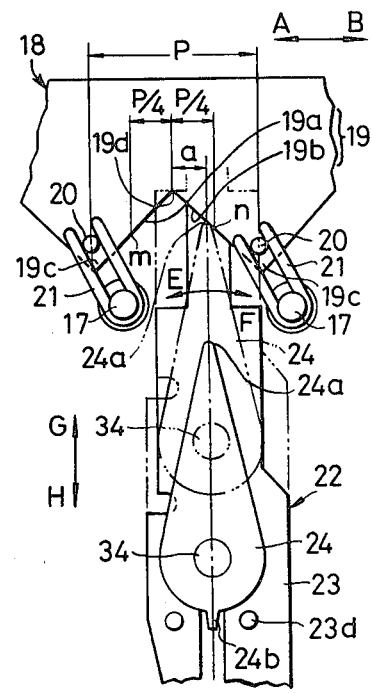
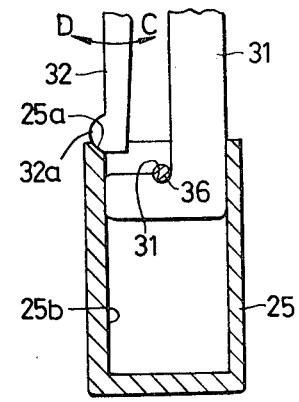

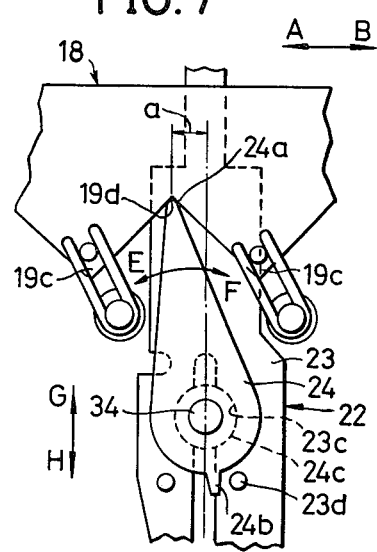
FIG. 7
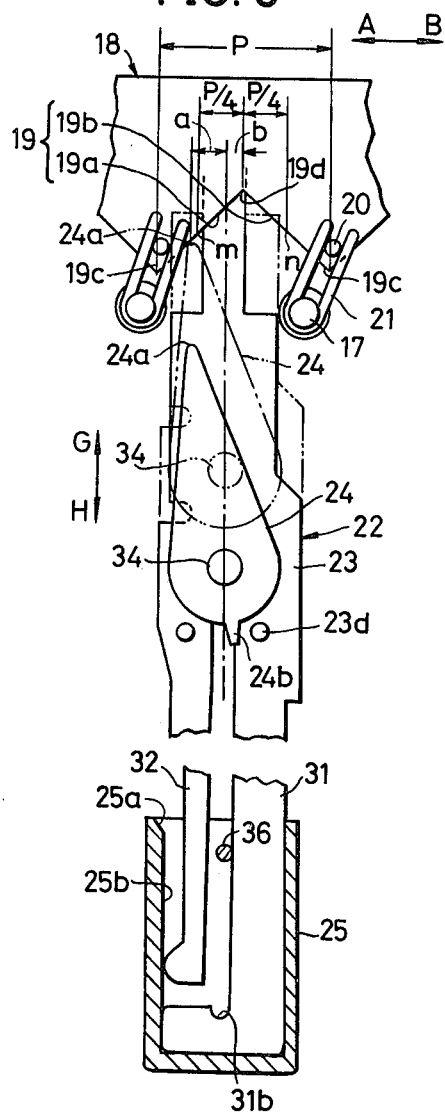
FIG. 8
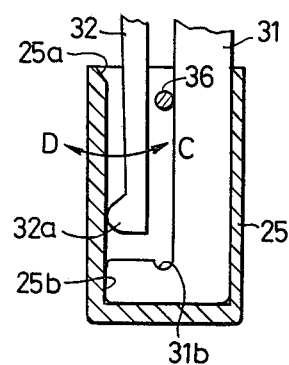

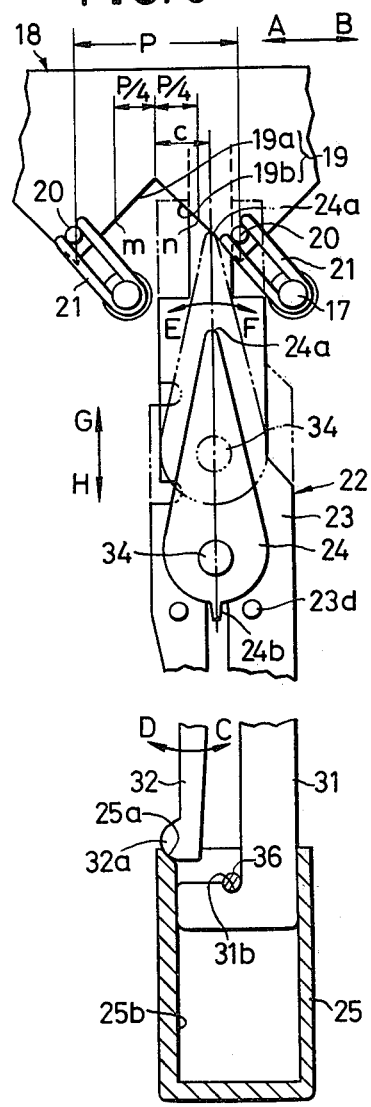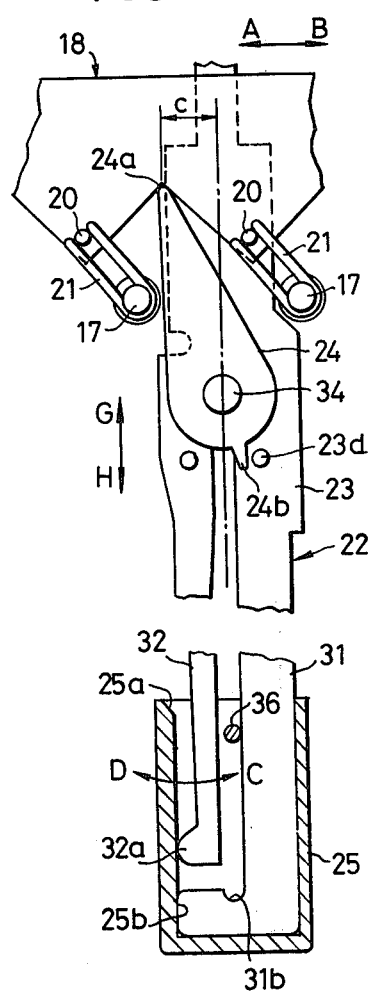

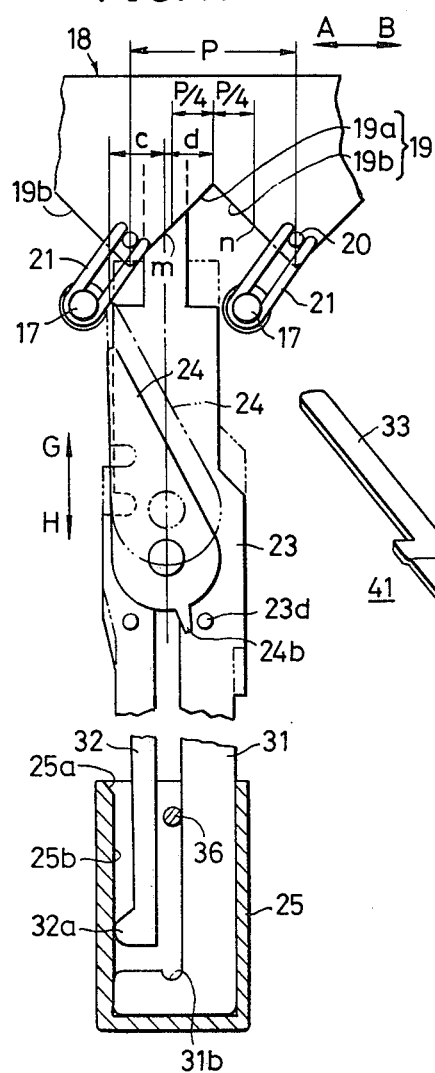
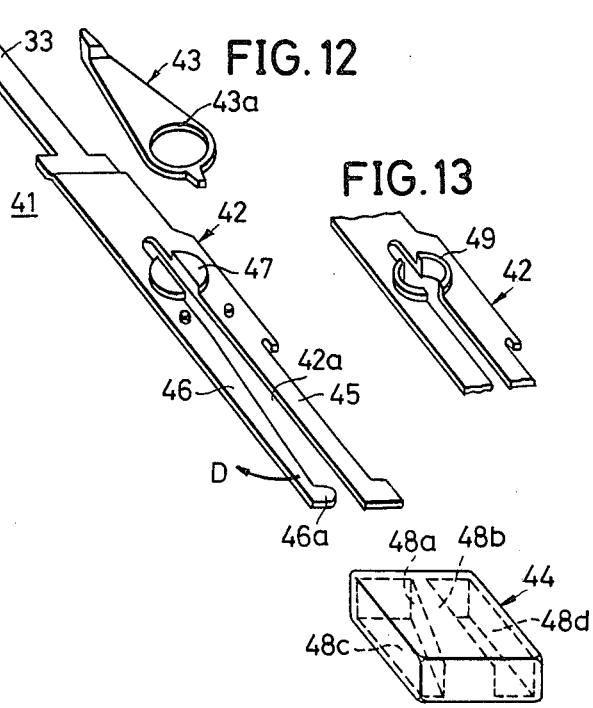

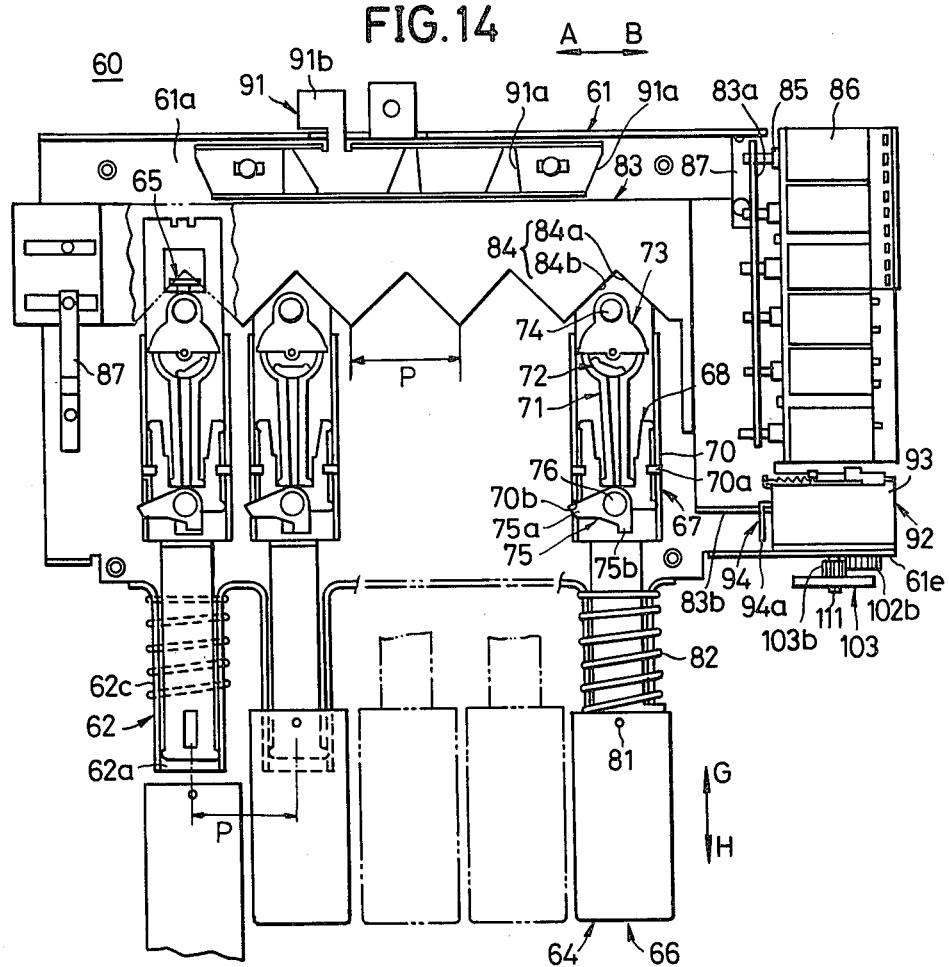
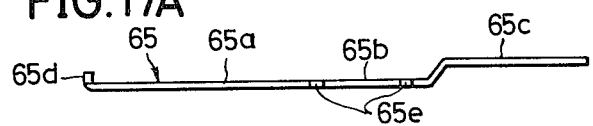
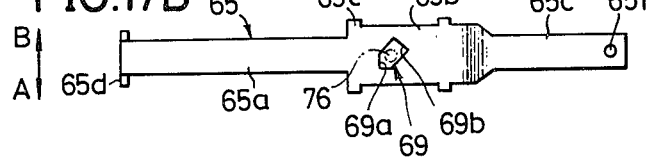

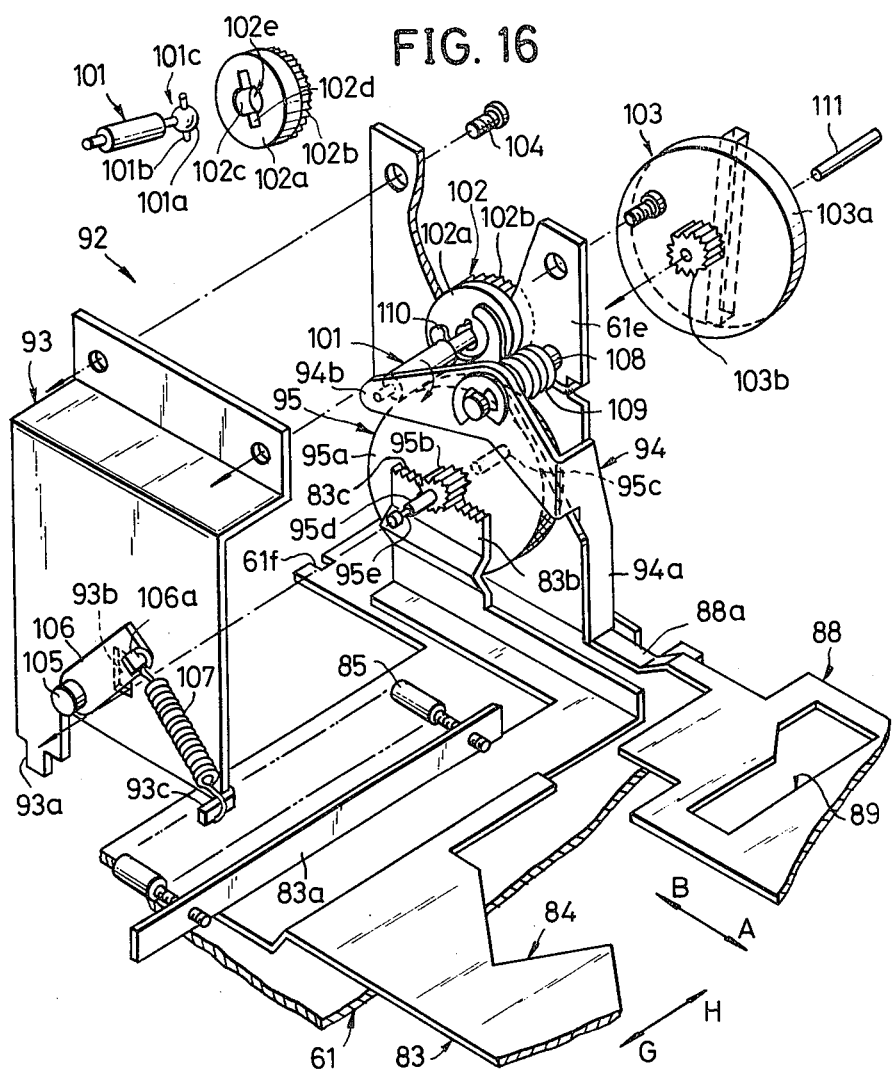

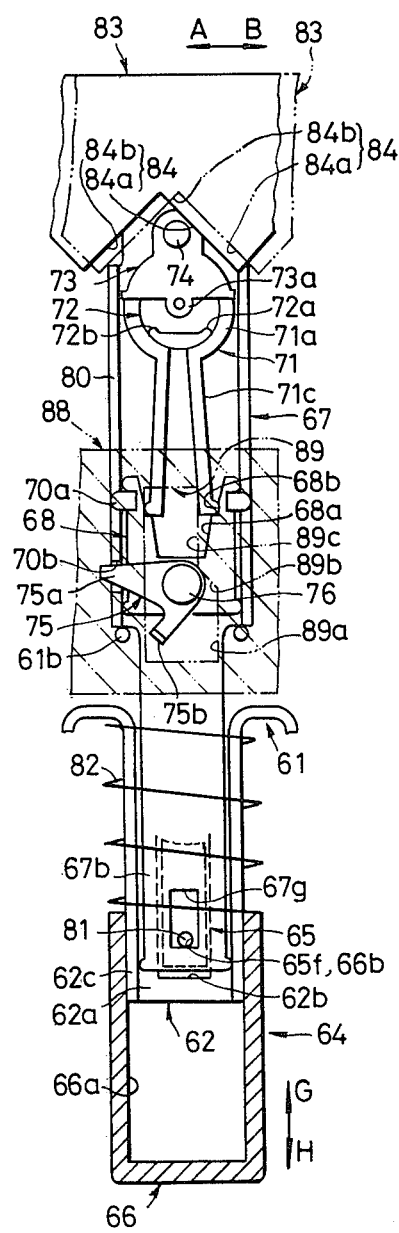
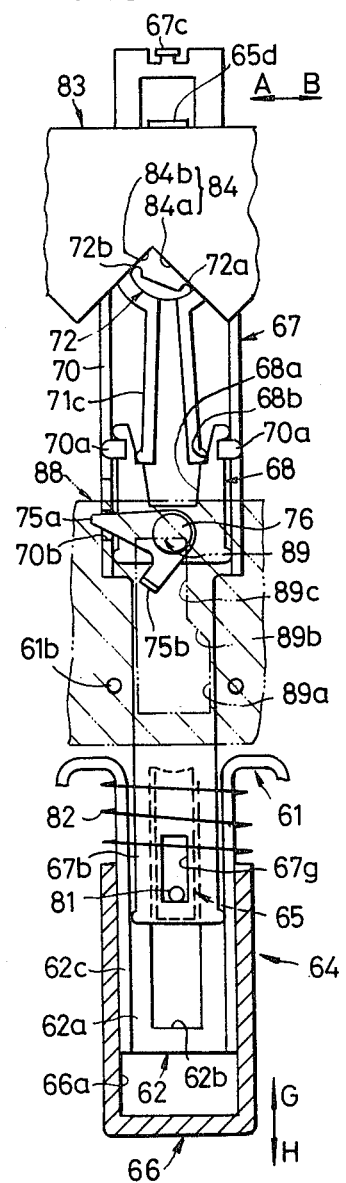

FIG. 21
FIG. 22
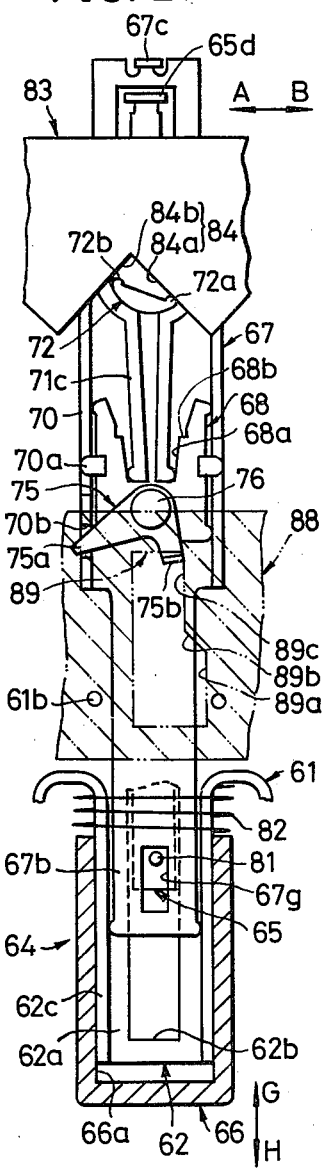
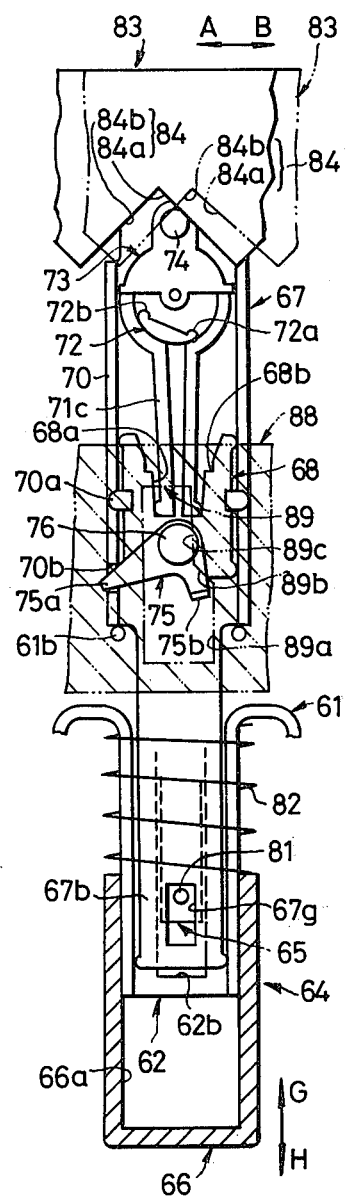

PUSH-BUTTON TYPE TUNER APPARATUS

BACKGROUND OF THE INVENTION

The present invention relates generally to push-button type tuner apparatuses, more particularly to a push-button type tuner apparatus wherein, pushing of a manually operated means causes at least one arm of a two-arm clamping means to undergo resilient rotational displacement in a horizontal plane to clamp a memory member between the two arms, whereby the overall thickness of the tuner apparatus is made small and the memory member is clamped in a stable manner whereby assuring improved tuning accuracy.

In general, push-button type tuner apparatuses known heretofore have been of a construction wherein a slide-plate is provided with a segmental memory piece and a lock plate. The slide-plate is pushed to cause the memory piece to undergo swinging displacement until it makes contact simultaneously with a pair of rods of a rotatable structure and then the lock plate to lock the memory piece thus swung. In these tuner apparatuses, the slide plate and the memory piece are disposed in a vertical plane in relation to the rotatable structure, which gives rise to a difficulty in that the overall thickness of the tuner apparatus becomes rather great.

SUMMARY OF THE INVENTION

Accordingly, it is a general object of the present invention to provide a novel and useful push-button type tuner apparatus in which the above described difficulty has been overcome.

Another and specific object of the present invention is to provide a push-button type tuner apparatus in which a clamping means is comprised of two arms and an extended part, one of the two arms and the extended part being supported on a frame structure so as to permit the clamping means to slide in a specific direction. Only the remaining arm undergoes rotational displacement to clamp and release a memory member. With this construction, clamping cam means can be formed in a push button which fits over the free ends of the two arms, thus reducing the number of parts required.

Still another object of the present invention is to provide a push-button type tuner apparatus in which clamping means has a pair of arms both of which undergo rotational displacement so as to approach and separate from each other. This construction ensures positive clamping of the memory member.

A further object of the present invention is to provide a push-button type tuner apparatus in which the manually operated means is further provided with sliding means, which has the memory member and clamping member supported slidably as a unitary structure with respect to the sliding means and has a clamping cam means supported slidably with respect to the sliding means. This construction eliminates the need for a special frame structure for supporting the clamping means and allows both arms of the clamping means to undergo resilient displacement.

A still further object of the present invention is to provide a push-button type tuner apparatus in which the manually operated means is further provided with push-button plate means at a side opposite to the clamping cam means of the sliding means, and a pin fixed to either the clamping cam means or the push-button plate means passes through a large opening on the sliding means and enters loosely into a small hole of the opposing push-button plate means or clamping cam means. With this construction, the clamping cam means, sliding means, and push-button plate means are independent of each other, thus facilitating assembly and disassembly.

A still further object of the present invention is to provide a push-button type tuner apparatus in which the aforementioned small hole has a slant side edge which pushes sideways on the aforementioned pin when the push-button plate means is pressed to its final position. Accordingly, the sliding means and the push-button plate means are forced to separate sideways from each other, which makes it possible to restrict the memory member at exactly the same position whenever the manually operated means is pressed, thus ensuring high accuracy in the tuning operation.

A still further object of the present invention is to provide a push-button type tuner apparatus in which the push-button plate means is slidably accommodated within the height of the flat frame structure. This construction makes it possible to effectively reduce the overall thickness of the apparatus.

A still further object of the present invention is to provide a push-button type tuner apparatus in which a pair of engagement parts of the memory member are brought into contact simultaneously with associated guide surfaces of a V-shaped cam, one part on each guide surface, the V-shaped cam being formed in a cam member supported slidably in the lateral direction. Accordingly, forces of equal magnitude are exerted on the slide cam member in opposing lateral directions, thus ensuring stable, highly accurate preset tuning.

Still another object of the present invention is to provide a push-button type tuner apparatus in which a push-button provided at the near end ("the near end" being defined as that nearer the operator) of the manually operated means is pressed to slide while being guided by a projection guide part unitarily formed in the frame structure. According to this construction, the manually operated means undergoes sliding motion in a stable manner without any play, thus ensuring high accuracy in preset and reset tuning.

Other objects and further features of the invention will be apparent from the following detailed description with respect to the preferred embodiments of the present invention when read in conjunction with the accompanying drawings.

BRIEF DESCRIPTION OF THE DRAWINGS

In the drawings:

FIG. 1 is a perspective view, with parts cut away, showing an essential part of a first embodiment of a push-button type tuner apparatus according to the present invention;

FIG. 2 is an exploded perspective view of a push-button structure in the apparatus shown in FIG. 1;

FIG. 3C is a front view, in vertical section, taken along the line IIIC—IIIC in FIG. 3A, as viewed in the arrow direction;

FIGS. 4A and 4B are fragmentary plan and side views, in vertical section, showing the construction of a guide lever and a cam plate in the apparatus shown in FIG. 1;

FIGS. 5A and 5B are, respectively, a plan view and a front view showing a spring plate for holding the memory member in the manually operated structure shown in FIG. 2;

FIGS. 6, 7 and 8 are plan views, with parts cut away, respectively showing the state of operation prior to pushing of the manually operated structure, after the manually operated structure has been pushed to its inwardmost position, and after the manually operated structure has been fully returned, all views relating to a case wherein the cam plate of the apparatus shown in FIG. 1 is slid for only a short distance.

FIGS. 9, 10, 11 are plan views, with parts cut away, respectively showing the state of operation prior to pushing of the manually operated structure, after the manually operated structure has been pushed to its inwardmost position, and after the manually operated structure has been fully returned, all views relating to a case wherein the cam plate of the apparatus shown in FIG. 1 is slid for a long distance.

FIG. 12 is an exploded perspective view of a manually operated structure applied in a second embodiment of the push-button type tuner apparatus according to the present invention;

FIG. 13 is a perspective view of an important part of a modified version of the manually operated structure shown in FIG. 12;

FIG. 14 is a plan view showing a third embodiment of the push-button type tuner apparatus according to the present invention;

FIG. 16 is an exploded perspective view of a clutch mechanism of the apparatus shown in FIG. 14;

FIGS. 17A and 17B are, respectively, a side view and a bottom view of a push-button plate in the manually operated structure of the apparatus shown in FIG. 14;

FIGS. 18A and 18B are, respectively, a side view and a bottom view of a slide plate in the manually operated structure of the apparatus shown in FIG. 14; and FIGS. 19, 20, 21 and 22 are plan views, with parts cut away, respectively showing the state of operation prior to pushing of the manually operational structure, after it has been pushed, after it has been pushed to its inwardmost position and after it has been fully returned, in the apparatus shown in FIG. 14.

DETAILED DESCRIPTION OF THE INVENTION

The general structure of a first embodiment of a push-button type tuner apparatus according to the present invention will be described with reference to FIG. 1 through FIGS. 3C.

Figure 3A:
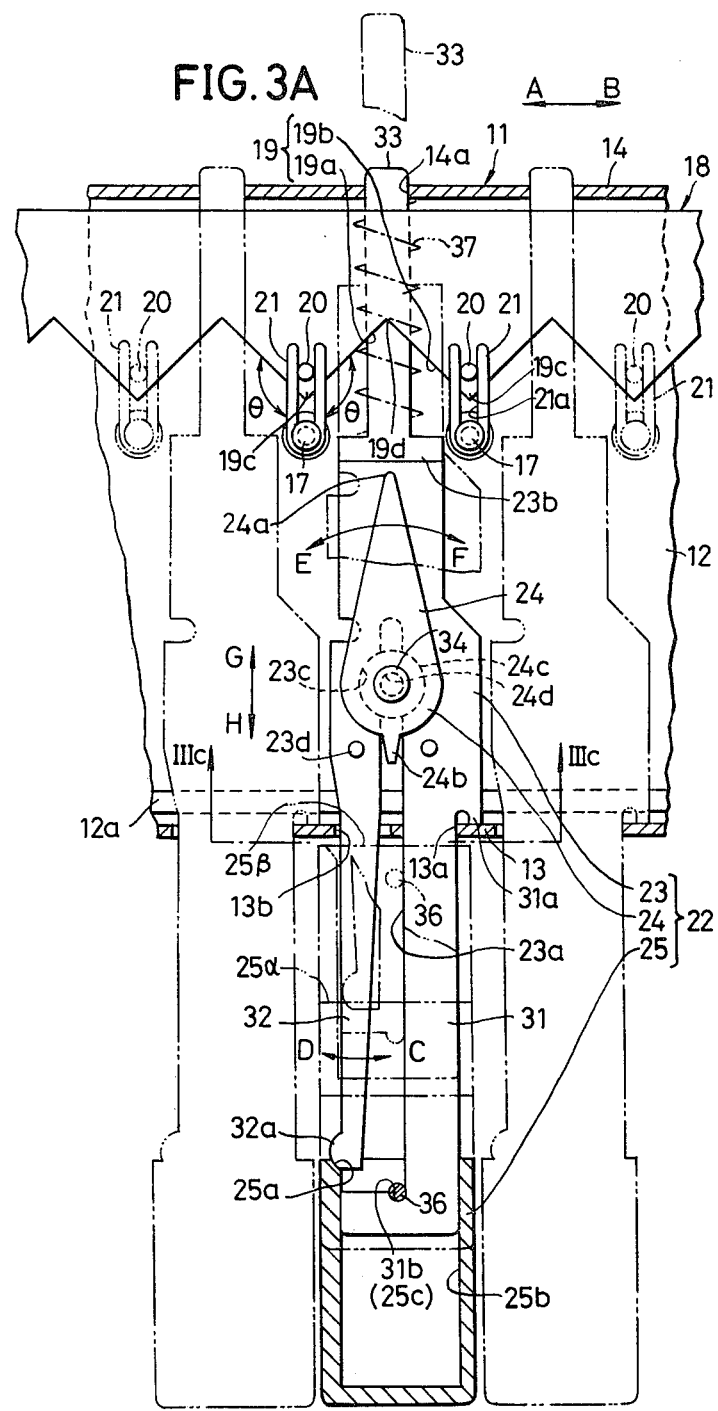
FIG. 3A is a plan view, with parts cut away, showing an essential part of the apparatus shown in FIG. 1.
Figure 3B:
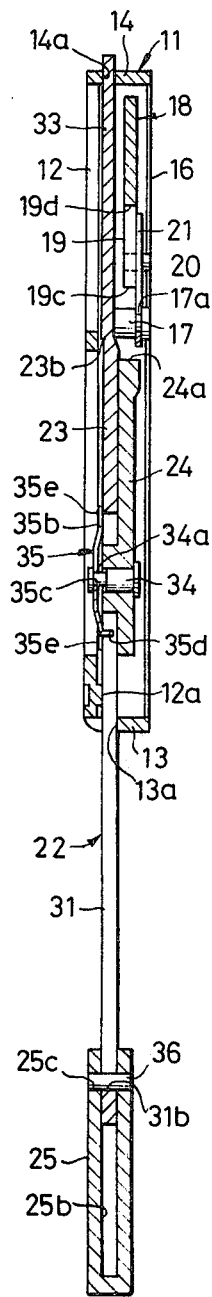
FIG. 3B is a side view, in vertical section, of the apparatus shown in FIG. 3A.

Referring to FIG. 1, a push-button type tuner apparatus 10 comprises a frame structure 11, which has a bottom plate 12, a front bend 13, a rear bend 14, and opposing side bends 15 press-formed unitarily (FIGS. 3A through 3C). A top cover 16 is attached to cover the frame structure 10. The bottom plate 12 is provided with an embossed internal projection bead 12a which projects to a specific height and extends laterally near the front bend 13, and is further provided with pins 17 which are embeddedly fixed to the bottom plate 12 at specific positions so as to each confront a crest 19c of a cam plate 18 when the cam plate 18 is in its neutral position. Each pin 17 has an annular groove 17a. For each slide plate 23, the front bend 13 is provided with a pair of square openings 13a and 13b and the rear bend 14 with a square opening 14a.

The cam plate 18 is supported by the opposite side bends 15 slidably in the directions indicated by arrows A and B as viewed in FIGS. 1 and 3A. The cam plate 18 slides responsive to operation of a tuning knob (not shown), and, in turn, moves a core (not shown) until a desired station is turned in. The cam plate 18 is provided at its front side with a plurality (for example, six) of V-shaped cam parts 19 each of which is associated with a manually operated structure 22 described below. Each cam part 19 comprises a pair of cam surfaces 19a and 19b. A pin 20 is fixed near the crest 19c of each cam part 19. The bottom of the cam part 19 is referred to as trough 19d. Here, defining the pitch of the cam parts 19 (meaning the distance between adjacent crests 19c or troughs 19d) as P, the cam plate 18 is adapted to slide to the left or right by a distance P/4 with respect to the neutral position thereof (the total slide distance being P/2) so that each cam part 19 remains in the vicinity of its associated manually operated structure 22. In actual practice, the sliding distance of the cam plate 18 is somewhat increased due to the operation of guide levers 21.

Each U-shaped guide lever 21 has a groove 21a and an E-shaped cut 21b formed as illustrated in FIGS. 3A, 3B, 4A and 4B. The E-shaped cut 21b is formed at the bottom of the groove 21a and makes this portion resemble a so-called E-ring. The guide lever 21 with its E-shaped cut 21b is rotatably fitted on the annular groove 17a of the pin 17 with its groove 21a engaged with the pin 20. Here, referring to FIG. 3A, the angle $\theta$ between the cam surface 19a (or 19b) and the external lateral surface of the guide lever 21 is determined to be less than 180 degrees, that is, $\theta > 180°$, at all times. If $\theta > 180°$, the crest 19c of the cam part 19 projects from the external lateral surface of the guide lever 21, as viewed in the plan view, thus causing the projected crest 19c to come into contact with a memory member 24, whereby the tuning operation is hampered.

Each manually operated structure 22 comprises a slide plate 23, a memory member 24, and a push-button 25. The slide plate 23 is provided at the near end thereof with an L-shaped slot 23a which divides the slide plate 23 into a main part 31 at right side thereof and a clamp arm part 32 at left side thereof. A projection 32a is unitarily formed at the free end of the clamp arm part 32. An extended part 33 extends by way of a step 23b from the main part 31. The slide plate 23 is further provided with a support opening 23c formed at an intermediate part of the slot 23a, a pair of stop pins 23d, a stop lug 31a and a catch recess 31b. The clamp arm part 32 is adapted to undergo resilient displacement in the directions indicated by arrows C and D as viewed in FIG. 2.

The memory member 24 is of elliptical configuration and consists of an engagement part 24a the far end of which is of increased thickness, a projection 24b at the near end, a boss 24c on the lower surface thereof, and a hole 24d. The memory member 24 is attached to the slide plate 23 by fitting the boss 24c into the support opening 23c and then by inserting a support pin 34 into the hole 24d, as indicated in FIG. 2. To the lower end of the support pin 34 which projects below the manually operated structure 22 is attached a spring plate 35. Namely, an opening 35c in the spring plate 35 is brought into engagement with an annular groove 34a of the support pin 34 while, at the same time, a bend 35d in the spring plate 35 is brought into engagement with the groove 23d. In addition to the opening 35c and the bend 35d, the spring plate 35 is provided with a narrow slot 35a and a pair of spring parts 35e (FIGS. 2, 5A and 5B). The narrow slot 35a and the bend 35d together assure that the attachment of the spring plate 35 is firm and free from any possibility of undesirable disengagement and rotation. Accordingly, the memory member 24 is supported rotatably in the directions indicated by arrows E and F (FIG. 3A) between rotational limit positions where the projection 24b comes into contact with the stop pins 23d. The memory member 24 rotates counter to a specific frictional force produced by the spring force of the spring parts 35e of the spring plate 35. The locally thickened engagement part 24a makes contact with both the cam plate 18 and the guide lever 21 in a laminar stacked arrangement with each other. Alternatively, the memory member 24 may be modified to be thickened equally throughout.

The push-button 25 has an opening 25b by which it is slidably fitted onto the near end of the main part 31 of the slide plate 23. In the normal (unpushed) state, the push-button 25 is positioned as indicated in FIGS. 3A and 3B, with a pin 36 engaged with the catch recess 31b and with a slant edge 25a thereof engaged with the projection 32a of the clamp arm part 32.

With this construction, each manually operated structure 22 is free to slide in the directions indicated by arrows G and H, that is, in the direction perpendicular to the sliding directions A and B of the cam plate 18, with the main part 31 fitted into the opening 13a in the front bent 13 and the extended part 33 fitted into the opening 14a in the rear bend 14, as indicated in FIG. 1 and FIGS. 3A through 3C. This structure 22 is normally urged to move in the arrow direction H in FIG. 3A by a coil spring 37 loosely fitted around the extended part 33. The rearward motion of the structure 22 is, however, limited by the stop lug 31a which comes into contact with the front bend 13. The clamp arm part 32 loosely passes through the opening 13b.

At the front support part of the slide plate 23, the main part 31 and the clamp arm part 32 are engaged at their upper surfaces with the top edge of the openings 13a and 13b and at their lower surfaces with the top of the projection bead 12a so that they are guided smoothly without play in the vertical direction, as indicated in FIGS. 3B and 3C. If the rectangular openings 13a and 13b should be arranged so that the bottom edges thereof make contact with the lower surface of the slide plate 23, the bottom edges of the openings 13a and 13b would inevitably have to be located in close proximity to the bottom plate 12, and this would lead to the bottom edges of the openings 13a and 13b being rounded at opposite ends thereof due to the compression deformation occurring the bending operation during press working which, in turn, would impair the smooth movement of the slide plate 23. The projection bead 12a also serves as a rib which reinforces the frame structure 11 against bending in the lateral direction. Moreover, the presence of the projection bead 12a limits the contact area of the slide plate 23 with the frame structure 11 to less than would be the case should the total lower surface of the slide plate 23 makes contact with the bottom plate 12. As a result, it possible to reduce the frictional force and thereby to improve operability of the structure 22.

Moreover, the slide plate 23 and the memory member 24 are respectively disposed in horizontal planes. This construction makes it possible to effectively reduce the overall thickness of the tuner apparatus 10 and, likewise, reduce the amount of space required for its installation in a vehicle. Furthermore, different from the known construction wherein a clamp member is provided as a component independent of the main body, the main part 31 and the clamp arm part 32 are unitarily formed in the slide plate 23. This arrangement not only facilitates the fabrication process but also minimizes accumulated component error to ensure high precision and good performance.

Next, a description is given of the operation of the push-button type tuner apparatus of the above construction.

First to be described is the case where the guide levers 21 are not utilized, that is, where the cam plate 18 undergoes sliding displacement of less than P/4 with respect to the neutral position thereof, with reference to FIGS. 6 through 8. Here, the midpoints of the cam surfaces 19a and 19b of the cam part 19 of the cam plate 18 are designated as points m and n.

For the sake of easy understanding, one instance is described where, responsive to the operation of the tuning knob, the cam plate 18 slides for a distance a (where, a <P/4) from the neutral position in the arrow direction A, as indicated in FIGS. 1 and 3A. Each pin 20 on the cam plate 18 shifts in the same direction, which, in turn, causes each guide lever 21 to rotate counterclockwise about its pin 17.

When a given button of the tuner to be preset for the tuning of the desired station thus tuned in, the push-button 25, which has beforehand been pulled with respect to the slide plate 23 to the position indicated in FIG. 6, is pushed inward to cause the manually operated structure 22 to slide in the direction of arrow G counter to the spring 37. The engagement part 24a of the memory member 24 comes into contact with the right hand side cam surface 19b at a point inward of the point n, that is, at a point separated by a distance a from the bottom (trough) 19d of the cam part 19, as indicated by a two-dot chain line in the same figure.

As the manually operated structure 22 slides further in the direction of arrow G, the memory member 24 is guided at the engagement part 24a thereof by the cam surface 19b and hence undergoes rotation in the direction of arrow E. The engagement part 24a moves for the distance a in the direction of arrow A and finally reaches the bottom 19d of the cam part 19. The limit position of the slide plate 23 is thus reached. At this time the far end of the push-button 25 is at the position designated by a reference numeral 25α in FIG. 3A. The slide plate 23 and the push-button 25 are maintained in the positional relationship indicated in FIG. 6 throughout this operation.

Following this, the push-button 25 is further pressed and caused to move with respect to the slide plate 23 in the direction of arrow A. The push-button 25 finally assumes the state indicated in FIG. 7. Specifically, as the push-button 25 is pressed, the projection 32a on the clamp arm part 32 is forced to ride up and to shift from the slant edge 25a to the internal surface of the opening 25b of the button 25, thus causing the clamp arm part 32 to turn resiliently in the direction of arrow C about a part near the memory member 24 at its rotational center. The clamp arm part 32 enters into the hollow 25b together with the main body 31. The push-button 25 is pressed up to the position designated by a reference numeral 25β in FIG. 3A, that is, up to the position where the bottom of the hollow 25b comes into abutment against the near side edge of the main part 31, as indicated in FIG. 7. The pin 36 moves out of the catch recess 31b and reaches the position indicated in the same figure.

As the clamp arm part 32 rotates in the direction of arrow C, the diameter of the support opening 23c decreases and the internal peripheral surface of the opening 23c tightly embraces the outer peripheral surface of the boss 24c of the memory member 24. The clamp arm part 32 thus clamps the memory member 24 at the above described position of rotation. When the pushing force is released from the push-botton 25, the manually operated structure 22 slides back, in the direction of arrow H to its original position where the stop lug 31a engages with the front bend 13. The positional relationship among the members of the manually operated structure 22 and between the push-button 25 and the slide plate 23 remains as shown in FIG. 7. Thus, preset tuning is completed.

Moreover, when the manually operated structure 22 slides, a clutch mechanism (not shown) is interrelatedly operated to disconnect the mechanical connection between the cam plate 18 and a tuning control section, and the cam plate 18 is thereby made slidable in the directions of arrows A and B counter to only a light load. Since the force required to rotate the memory member 24 is much smaller than that for sliding the cam plate 18, little or no problem arises in actual practice. A third embodiment described further below is designed to completely eliminate any possible unwanted movement of the cam plate in the preset tuning operation.

Next, the operation for retuning will be described. For the purpose of explanation, it is assumed that prior to the retuning operation the cam plate 18 has been left in a position shifted in the direction of arrow B by a distance b (where, b<P/4) with respect to the neutral position, as indicated in FIG. 8. This is a situation such as would occur when another station had been tuned in. The guide levers 21 hence have been rotated clockwise.

The push-button 25 is pressed to slide the manually operated structure 22 in the direction of arrow G as viewed in FIG. 8. The memory member 24 moves from the position indicated in full lines to the position indicated in two-dot chain lines in the same figure and hence the engagement part 24a comes into contact with the left side cam surface 19a at a position outward of the point m, that is, at a position leftward from the bottom 19d by the distance (a+b). The result is the same also in the case where the engagement part 24a makes contact with the cam surface 19a at a position inward from the point m.

When the push-button 25 is depressed, the mechanical connection between the cam plate 18 and the manual tuning section is disconnected, whereby the sliding load of the cam plate 18 becomes small, similarly as in the preceding case. As the memory member 24 is in a clamped state, it moves in the direction indicated by arrow G while maintaining its positional relationship with respect to the slide plate 23 even after it abuts against the cam surface 19a. Accordingly, the cam plate 18 with the cam surface 19a is guided by the engagement part 24a of the clamped memory member 24 and is hence caused to slide in the direction of arrow A in FIG. 8. The cam plate 18 slides for the distance (a+b), at which time the engagement part 24a reaches the bottom 19d of the cam part 19. Thus it is restored to the position indicated in FIG. 7. Together with the sliding displacement of the cam plate 18, the guide levers 21 are rotated counterclockwise. Then, the manually operated structure 22 is returned to its original position by the spring 37. As a consequence, the retuning of the desired station is now completed.

In the above described retuning operation, the cam plate 18 is required to slide for the distance (a+b) while either cam surface 19a or cam surface 19b (each having a width of P/2) is guided by the engagement part 14a. In this connection, the distance (a+b) must be less than P/2, that is, the distance a or b must be less than P/4. Accordingly, the sliding distance of the cam plate 18 is limited to P/4 both rightward and leftward with respect to the neutral position, that is, up to a total distance of P/2. If the sliding distance of the cam plate 18 exceeds this limit so that (a+b) >P/2, the manually operated structure 22 will come to oppose the cam part 19 adjacent to the associated cam part 19, thus making it impossible to perform correct tuning operation.

When the same push-button 25 is to be preset for the tuning of another station, the push-button 25 is pulled further in the direction of arrow H in FIG. 8. The push-button 25 slides alone in the direction of arrow H because the movement of the slide plate 23 in the same direction is limited by the front bend 13. The push-button thus slides with respect to the slide plate 23 until the pin 36 comes into engagement with the catch recess 31b, as illustrated in FIG. 6. As the push-button 25 undergoes sliding motion, the clamp arm part 32 passes out of the opening 25b of the push-button 25, and the projection part 32a of the clamp arm part 32 is thereby brought into contact with the slant edge 25a of the push-button 25. Accordingly, the clamp arm part 32 resiliently undergoes rotation movement in the direction of arrow D and returns to the original position thereof, whereby the memory member 24 is released from claimping, thus making it possible to carry out the succeeding preset operation.

In the above described embodiment, the maximum sliding range of the cam plate 18 is P/2 and this is a relatively narrow range for accommodating all stations to be tuned in. Therefore, there arises the problem that tuning accuracy may, depending on circumstances, be insufficient. This problem can be eliminated by selecting the pitch P of the cam parts 19 of the cam plate 18 at a large value, but this arrangement concurrently increases the length of the cam plate 18, the intervals between adjacent manually operated structures 22, and the slide stroke of the operational structure, thus making the apparatus bulky. In the embodiment to be described next, the guide levers 21 are used to increase the allowable sliding distance of the cam plate 18 without increasing the size of the apparatus. This embodiment will be described with reference to FIGS. 9 through 11. In FIGS. 9 through 11, those parts which are the same as corresponding parts in FIGS. 6 through 8 are designated by like reference numerals. Detailed description of such parts will not be repeated.

Upon preset tuning operation, manual operation of the tuning knob causes, the cam plate 18 to slide for a distance c (where, c>P/4) in the direction of arrow A with respect to the neutral position thereof, and a desired station is tuned in. Then, the manually operated structure 22 is pushed via the push-button 25. The engagement part 24a of the memory member 24 comes into contact with the cam surface 19b at a position outward of the point n and hence undergoes rotation movement in the direction of arrow E. This memory member 24 is clamped by the engagement part 24a so as to be held in a position shifted leftwards by the distance c, as indicated in FIG. 10, thus completing preset tuning.

Here, it is supposed that, prior to the preset tuning operation, the cam plate 18 has been shifted in the direction of arrow B by the tuning knob so as to assume a new position shifted rightwards by a distance d from the neutral position thereof, where, $d > P/4$, that is, $(c+d) > P/2$. The engagement part 24a thereby offsets from the associated cam part 19 and comes to confront the cam surface 19b of the adjacent cam part 19. However, when the manually operated structure 22 is pushed, the engagement part 24a of the clamped memory member 24 is first brought into contact with the guide lever 21 and causes the same to rotate counterclockwise thereby to shift the cam plate 18 in the direction of arrow A. As the manually operated structure 22 is further pushed, the engagement part 24a engages the cam surface 19a of the associated cam part 19, thus reproducing the state indicated in FIG. 10.

Specifically, the guide lever 21 serves to bring the engagement part 24a of the clamped memory member 24 into contact with the cam surface 19a or 19b of the associated cam part 19. This means that the cam plate 18 is allowed to slide by more than P/2. The above embodiment is described as to the instance where the distance c or $d > P/4$. In actual practice, if the equation $(c+d) > P/2$ is satisfied (where one of c or d may be less than P/4), the guide lever 21 operates normally. In a practical example, the total sliding distance of the cam plate 18 is limited to 8 mm without the guide lever 21, but this distance increases to 10 mm through the provision of the guide lever 21. This increase greatly improves the tuning accuracy. Refinements in design can make the sliding distance more than 10 mm.

FIG. 12 shows another embodiment of a manually operated structure which can be applied to the above described push-button type tuner apparatus. Differently from the manually operated structure 22 illustrated in FIG. 2, the manually operated structure 41 shown in FIG. 12 is adapted to immobilize the memory member by the outward radial movement of a projection which, being provided on the slide plate, fits within a hole in the memory member. Specifically, the manually operated structure 41 comprises a slide plate 42, a memory member 43, and a push-button 44. The slide plate 42 has a main part 45 and a resiliently displaceable clamp arm part 46 which are formed unitarily. A projection 46a is formed inwardly at the free end of the clamp arm part 46. The main part 45 and the clamp arm part 46 respectively have projections at positions opposing each other across a slot therebetween. These projections constitute a boss 47 for supporting the memory member 43. The memory member 43 is rotatably supported by the engagement of a large hole 43a with the boss 47. The members for holding the memory member 43 in position are not shown. The push-button 44 has two holes 48c and 48d on opposite sides of a center partition 48b. One surface of the partition 48b extends obliquely sidewards. This push-button 44 is attached to the slide plate 42 with the rear ends of the main part 45 and the clamp arm part 46 inserted into the holes 48d and 48c, respectively.

When the manually operated structure 41 is pushed, the memory member 43 is brought into contact with the cam plate 18 and is then turned until it reaches the bottom 19d. The push-button 44 is further pushed by itself, and the projection part 46a thereby rides up the slope surface 48a, thus causing the clamp arm part 46 to undergo rotational movement in the direction of arrow D, which is opposite to the rotational direction in the above described embodiment. Accordingly, the outer diameter of the boss 47 is expanded to immobilize the memory member 47 in its rotational position, thus completing the preset tuning. Other operations are the same as those in the above described embodiment.

Additionally, a modification of the slide plate 42 is indicated in FIG. 13. In this modification, the boss 47 is replaced by a boss 49 of annular shape. This boss 49 has somewhat better resiliency in the clamping direction, thus achieving more stable clamping operation.

Alternatively, if the tuner apparatus is not required to have a flat structure, both the slide plate and the memory member may be disposed vertically instead horizontally. Such modified construction also affords the same advantageous features as those obtained in the above described embodiment, except that the thickness is large.

A third embodiment of a push-button type tuner apparatus according to the present invention is now be described in conjunction with FIGS. 14 through 16.

Referring to FIG. 14, a push-button type tuner apparatus 60 has a frame bottom plate 61. The frame bottom plate 61 is provided with five guide extensions 62 which are formed unitarily with the bottom plate 61 along the front edge of a bottom plate part 61a at a regular pitch interval of P in side-by-side relationship, as illustrated in FIGS. 14 through 16. Each guide extension 62 consists of a guide plate part 62a having a guide groove 62b formed therein and guide parts 62c bent upwards at the opposite lateral sides thereof. At positions corresponding to the guide groove 62b, the bottom plate 61a is provided with five guide slots 63, each having a small-width slot part 63a and a large-width slot part 63b. A pair of stop pins 61b and a pair of cut-and-bent guide lugs 61c are provided on the bottom plate 61a, one of each pair on either side of the guide slot 63. Six tuning coils 86 are mounted in parallel relationship on the upstanding wall on the right side of the frame bottom plate 61.

Each of five manually operated structures 64 is constituted of a push-button plate 65 having a push-button 66 fixed thereto, a slide plate 67, and a clamp cam plate 68. The push-button plate 65 is belt snaped and comprises a rear plate part 65a and a main plate part 65b on the same level, and a front plate part 65c stepped upward with respect to the main plate part 65b, as indicated in FIGS. 15, 17A and 17B. A T-shaped lug 65d is formed at the rear end of the push-button plate 65. The main plate part 65b is provided with a hole 69 defined by inclined edges at a center thereof, and with guide projections 65e at opposite sides thereof. A small hole 65f is formed in the front plate part 65c. The inclined-edge hole 69 is of the shape indicated in FIG. 17B, and has an edge 69a which extends in parallel with the direction of arrows A and B, and another edge 69b which extends at an angle to said direction.

Figure 15:
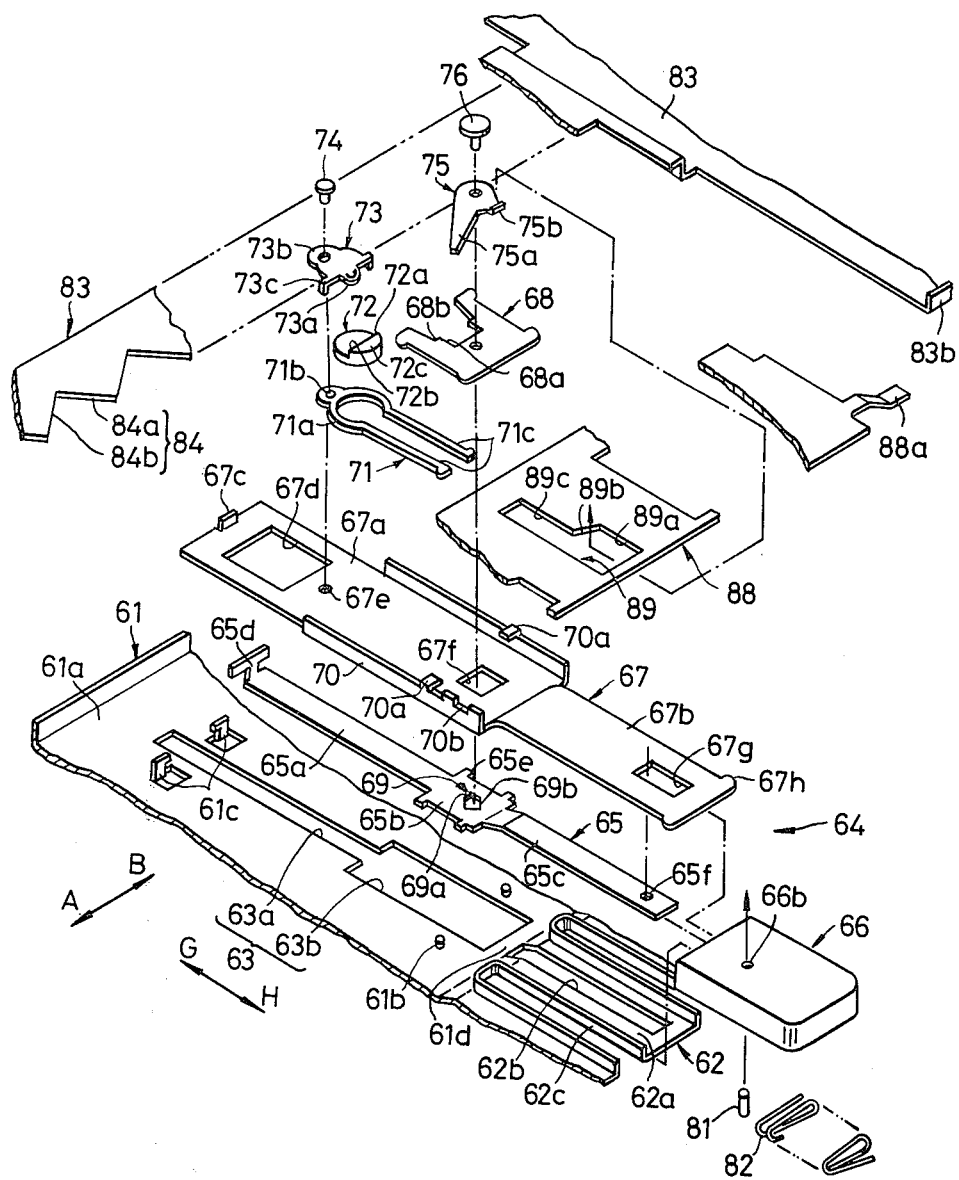
FIG. 15 is an exploded perspective view of the manually operated structure of the apparatus shown in FIG. 14 and parts associated therewith.

The slide plate 67 substantially consists of a main plate part 67a and a front plate part 67b, and an upwardly bent part interposed therebetween, as indicated in FIG. 15, and FIGS. 18A and 18B. The main plate part 67a is provided, at its rear part, a lug 67c bent upward, an opening 67d, and a hole 67e, and, at its front part, with an opening 67f, and further, at its opposite lateral sides, with upwardly bent guides 70. The front plate part 67b is provided with a slot 67g and guide projections 67h at either side thereof. The bent guides 70 are respectively provided with bent engaging parts 70a. An engaging recess 70b is formed only in the bent guide 70 on the left side, as viewed in FIG. 15.

On the upper surface of the slide plate 67, are provided a clamp spring 71, a memory member 72, a spring plate 73 and the like. The clamp spring 71 comprises a ring part 71a and a pair of leg parts 71c extending forwardly from the ring part 71a. A hole 71b is provided in the ring part 71a. The memory member 72 is of disc shape, and has a projecting step 72c formed thereon over the front-side half part thereof and the projecting step 72c has a pair of engagement parts 72a and 72b. This disc-shaped memory member 72 is rotatably fitted into the ring part 71a of the clamp spring 71. The spring plate 73 is of semicircular shape, and comprises a pressing tongue 73a, a hole 73b, and lugs 73c at opposite sides thereof. A pin 74 is passed successively through the hole 73b of the spring plate 73, and the hole 71b of the clamp spring 71 supporting the memory member 72 therein, and is caulked to the hole 67e of the slide plate 67, whereby the components 71 through 73 are secured to the slide plate 67 as illustrated in FIG. 19. The spring plate 73 is restrained in its position with respect to the clamp spring 71 by the engagement of the lugs 73c with the outer periphery of the ring part 71a of the clamp spring 71, and the pressing tongue 73a serves to press the memory member 72 against the slide plate 67 thus preventing the memory member 72 from rising off the slide plate 67 when the memory member 72 rotates. Here, the memory member 72 is assumed to be positioned in the neutral position of rotation when the engagement parts 72a and 72b are symmetrically positioned with respect to the longitudinal center line of the slide plate 67.

The clamp cam plate 68 is of a substantially square shape and is provided with a taper cut 68a which converges inwardly from its opening and with a step 68b midway of the taper cut 68a. This clamp cam plate 68 has a rotation piece 75 supported thereon rotatably by a pin 76. This pin 76 is fixed to the cam plate 68 by caluling so as to project downwards by a specific length from the cam plate 68. The V-shaped rotation piece 75 comprises a lever part 75a and a lug 75b bent upward.

This clamp cam plate 68 is placed on the main plate 67a of the slide plate 67 with its width accommodated between the bent guides 70 and its thickness interposed between the main plate 67a and the pair of lugs 70a. In this state, the lever part 75a of the rotation piece 75 enters into the engaging recess 70b, and the pin 76, at a part projected downwards, passes through the opening 67f and projects further downwardly. This clamp cam plate 68 is slidable in the directions of arrows G and H with respect to the slide plate 67, but is normally restricted at a position where the free ends of the pair of legs 71c of the clamp spring 71 resiliently engage with their associated steps 68b, as indicated in FIG. 19. In this state, the memory member 72 is still freely rotatably, the pin 76 is positioned at the forward side in the opening 67f, and the rotation piece 75 is at its rotation limit position in the clockwise direction.

The push-button plate 65 is attached to the frame structure 61 with the rear plate part 65a, the main plate part 65b and the front plate part 65c respectively accommodated into the small-width part 63a, the large-width part 63b of the guide slot 63, and the guide groove 62b, and the T-shaped lugs 65d engage the opposite edge parts of the narrow slot 63a and the front plate part 65c is engaged with a narrow width part 61d of the bottom plate part 61a. The push-button plate 65 thus fabricated is disposed so that the rear plate part 65a and the main plate part 65b are accommodated within the thick dimension of the bottom plate part 61a and the front plate part 65c within the thick dimension of the guide plate parts 62a of the guide extension 62, and further is slidable in the direction of arrows G and H with the guide projections 65e being respectively guide by the opposing inner side surfaces of the large-width slot part 63b. Accordingly, the push-button plate 65 is disposed within the thickness of the frame bottom plate 61, an arrangement of which is effective for reducing the total thickness of the tuner apparatus.

The slide plate 67 which has been provided with the clamp cam plate 68 is attached over the push-button plate 65 in such a manner that the main plate part 67a is placed on the bottom plate part 61a with the opposite sides engaged with associated cut-and-bent guide lugs 61c, and that the front plate 67b is placed on the guide plate part 62a with the bent guides 62c interposed therebetween. The so attached slide plate 67 is slidable in the direction of arrows G and H. The T-shaped lug 65d is projected into the opening 67d of the slide plate 67, and the bottom end part of the pin 76 is loosely enters into the hole 69 with inclined edges.

The push-button 66 is provided with a guide hollow 66a and a pin hole 66b. It is fitted around the guide extension 62 of the frame bottom plate 61 and fixed by a pin 81 inserted into the hole 66b. This pin 81 passes through the slot 67g in the slide plate 67 and is also inserted into the pin hole 65f in the push-button plate 65. With this construction, the push-button 66 and the push-button plate 65 slide unitarily. The push-button plate 65, the push-button 66, the slide plate 67, and the clamp cam plate 68 fabricated as described above constitute the manually operated structure 64.

This manually operated structure 64 is normally urged to move in the direction of arrow H by a coil spring 82 loosely fitted around the guide extension 62. This motion of the manually operated structure 64 is limited by the parallel edge 69a of the hole 69 abutting against the pin 76, by the pin 81 abutting against a front-side edge of the slot 67g, and further by the front edge of the main plate 67a abutting against the pair of stop pins 61b.

A cam plate 83 comprises five V-shaped cam parts 84 (each having right and left cam surfaces 84a and 84b) which are disposed in parallel with each other at a pitch P. Cores 85 (six cores, for example) are screwed onto a bent part 83a at the right side as viewed in FIG. 14. A rack 83c (FIG. 16) is formed on another bent part 83b. The cam plate 83 is supported on the bottom plate part 61a of the frame bottom plate 61 slidably in the direction of arrows A and B with the aid of a guide groove and pin (not shown). The V-shaped cam parts 84 are disposed above the manually operated structure 64. The cam plate 83 is normally positioned at its neutral position as indicated by the two-dot chain line in FIG. 19, where the bottom of each V-shaped cam part 84 coincides with the center of the associated manually operated structure 64 and confronts the pair of engagement parts 72a and 72b on the memory member 72. The cores 85 are adapted to move in-and-out of their coils 86 mounted on the frame bottom plate 61, and the rack 83c is meshed with a pinion 95b described later. The cam plate 83 is pushed down by means of a pair of leaf springs 87 at opposite lateral ends thereof, as indicated in FIG. 14.

A clutch lever plate 88 is provided with five cam windows 89 at pitch P and an extension 88a at the right end in FIG. 15, and is supported on the lower surface of the frame cover plate (not shown) in a slidable manner in the directions of arrows A and B. Each lug 75b of the rotation piece 75 enters into an associated cam window 89. The cam window 89 comprises a recessed edge 89a and a straight edge 89c, and a sloped edge 89b connecting therebetween. The clutch lever plate 88 is normally positioned at its neutral position where the extension 88a makes contact with or is slightly separated from an arm part 94a of an arm member 94 as indicated in FIG. 16, and the lug 75b of the rotation piece 75 is positioned confronting the recessed edge 89a of the cam window 89 as indicated in FIG. 19.

A frequency-band changeover lever plate 91 comprises five cam parts 91a and one lever part 91b, and is supported slidably in the direction of arrows A and B on the bottom plate part 61a of the frame bottom plate 61, as indicated in FIG. 14. When a manually operated structure 64 is pushed, the lever plate 91 is caused to slide in the direction of arrow A or B with the cam part 91a engaged by the lug 67c of the slide plate 67. The lever part 91b actuates a switch (not shown) of the frequency-band changeover circuit, thus selecting a desired frequency band.

A clutch mechanism 92 comprises a support plate 93, a rotatable arm 94, a drum 95, a roller 101, an intermediate shaft 102, and an Oldham's coupling 103, all of which are assembled on an upright plate part 61e of the frame bottom plate 61, as indicated in FIGS. 14 and 16. The support plate 93 is fixed to the vertical plate part 61e by a pair of screws 104, with a bottom projection 93a engaged with a cut 61f of the frame bottom plate 61. An arm 106 pivoted on a pin 105 is urged to rotate by a coil spring 107 stretched between itself and a lug 106a, and makes pressing contact with a shaft 95d projecting through a square window 93b at a small redius part 95e thereof.

The rotatable arm 94 comprises arm parts 94a and 94b and is pivoted on a pin 108 fixed to the upright plate part 61e. This arm 94 is urged to rotate counterclockwise in FIG. 16 by a torsion spring 109, whereby the roller 101 supported on the arm part 94b presses against a drum part 95a of the drum 95. The other arm part 94a of the arm 94 confronts the extension 88a of the lever plate 88.

The drum 95 comprises a large-diameter drum part 95a having a knurled outer peripheral surface, a pinion 95b, and shafts 95c and 95d, all of which assume a coaxial unitary structure. This drum 95 is pivotally supported by the shaft 95d on the upright plate part 61e, and the pinion 95b meshes with the rack 83c of the cam plate 83. Due to the arm 106, the free end of the shaft 95d is pressed against the right side edge of the square window 93b and further downwards. Accordingly, the pinion 95b makes positive meshed engagement with the rack 83c so that there is no wobble in the direction of arrows A and B, thus ensuring ideal transmission operation without backlash.

A projection 101c is provided at the right end part of a roller 101, which projection 101c comprises a sphere part 101a and a pair of pins 101b projected radially therefrom. This projection 101c is connected to a recess 102e in the intermediate shaft 102, thus constituting universal joint.

The intermediate shaft 102 is a unitary structure with a flange 102a and a gear part 102b. This shaft 102 is provided with the recess 102e at the left side in FIG. 16, consisting of round hole 102c and a pair of cuts 102d. This shaft 102 is stably supported on the upright plate part 61e with the flange 102a forced to make contact with the edge of a hole (not shown) in the vertical plate part 61e by a U-shaped leaf spring 110 screwed to the vertical plate part 61e, and the gear part 102b is projected from the vertical plate part 61e.

The Oldham's coupling 103 comprises a coupling disc 103a having a projection, and a pinion 103b, which assume a coaxial unitary structure. This Oldham's coupling 103 is rotatably supported on a shaft 111 fixed to the upright plate part 61a, and the pinion 103b is meshed with the gear part 102b of the intermediate shaft 102. A manual tuning knob is connected by way of an Oldham's coupling disc having a groove (neither of which is shown) to the coupling disc 103a.

Next, a description is given of the operation of the push-button type tuner apparatus of the above described construction, with further reference to FIGS. 19 through 22.

When the tuning knob is turned, the Oldham's coupling 103 is caused to rotate in the direction indicated by arrow in FIG. 16. This rotation is successively transmitted by way of the pinion 103b, the gear part 102b, the roller 101, and the drum part 95a to the pinion 95b to rotate counterclockwise. Accordingly, the pinion-rack mechanism causes the cam plate 83 to slide in the direction of arrow A in FIG. 16 to a position indicated by the two-dot chain line in FIG. 19. In conjunction with this movement of the cam plate 83, the cores 85 move relative to the coils 86, whereby a desired station is tuned in.

When a push-button 66 is to be preset for the tuning of the above desired station, the desired push-button 66 is pushed in the direction of arrow G in FIG. 19 counter to the coil spring 82. When the push-button plate 65 has slid for a very small distance together with the push-button 66, the slope edge 69b approaches and makes contact with the pin 76. As the push-button 66 is pushed further, the pin 76 is subjected to a pushing force and moves in the same direction together with the clamp cam plate 68, the clamp spring 71 and the slide plate 67. Accordingly, the components of the manually operated structure 64 undergo sliding motion unitarily in the direction of arrow H. The memory member 72 approaches the V-shaped cam part 84 of the cam plate 83, and the engagement part 72a at the right hand side is first brought into contact with the cam surface 84a of the cam part 84. This causes the memory member 72 to turn clockwise in FIG. 19 until the opposite engagement part 72b makes contact with the cam surface 84b. At this moment, the manually operated structure 64 encounters a large load and the pushing operation is temporarily stopped.

Moreover, due to the pushing operation up to this moment, the frequency-band changeover lever plate 91 has already been shifted and restricted by the lug 67c of the slide plate 67, and the predetermined frequency-band circuit has been rendered operative. The rotation piece 75 also shifts to the position where the lub 75b thereof confronts the straight edge 89c as indicated in FIG. 20.

When the push-button 66 is further pressed, the push-button plate 65 and the clamp cam plate 68 move with respect to the slide plate 67 in the direction of arrow G, with the main plate part 65b and the clamp cam plate 68 respectively subjected to guidance by the large-width slot 63b and bent guides 70. As the clamp cam plate 68 moves, the free ends of the legs 71c of the clamp spring 71 are forced to enter into and move to the bottom of the taper cut 68a, at which point the sliding motion of the push-button plate 65 and the clamp cam plate 68 is restricted. At the same time, the clamp spring 71 is sujected to resilient deformation in such a manner that the pair of legs 71c approach each other to reduce the inner diameter of the ring part 71a. As a result, the memory member 72 is tightly embraced by the ring part 71a and is thereby clamped at the above described position of rotation. The pins 76 and 81 are respectively positioned near the front side edges of the opening 67f and slot 67g.

When the clamp cam plate 68 moves in the direction of arrow G independent of the slide plate 67, the rotation piece 75 undergoes rotation clockwise about the lever part 75a which is caught in the recess 70b, up to the final position of rotation indicated in FIG. 21. Due to the rotation of the piece 75, the lub 75b approaches and makes contact with the straight edge 89c of the cam window 89, thus causing the clutch lever plate 88 to slide for a small distance in the direction of arrow B, from the position indicated in FIG. 20 to the position indicated in FIG. 21. The extension 88a of the lever plate 88 thereby pushes the arm part 94a of the arm 94 in the direction of arrow B, thus causing the arm 94 to rotate clockwise counter to the spring 109 in FIG. 16. As the arm 94 rotates, the roller 101 is lifted to separate from the drum part 95a, thus disconnecting the mechanical connection between the roller 101 and the drum 95. The cam plate 83 is now set free from the manual tuning mechanism and slides counter to a small sliding load.

The sliding load of the cam plate 83 is required to be small during reset tuning operation, but a small load is not preferable when preset tuning operation. In this connection, the present embodiment is arranged so that the pair of legs 71c of the clamp spring 71 are guided by the taper cut 68a of the clamp cam plate 68, before the lug 75b of the rotation piece 75 reaches the straight edge of the cam window 89, that is, so that the clamp spring 71 provisionally clamps the memory member 72 before the clutch lever plate 88 starts to slide. Accordingly, even if sliding load on the cam plate 83 thereafter becomes small, the memory member 72 will not fluctuate when subjected to an external impact via the push-button plate 65 etc. since it is clamped at the above described provisionally clamped position of rotation. Thus preset tuning of the desired station can be carried out with high accuracy.

When the manually operated structure 64 is pushed to its innermost position as indicated in FIG. 21, the sloped edge 69b of the hole 69 pushes the pin 76 with a large force, which causes, in turn, the push-button plate 65 and the clamp cam plate 68 to repel each other sideways. Accordingly, the push-button plate 65 is applied with a rightward force, and the right-side guide projection 65e of the main plate part 65b makes pressing engagement against the right-side inner edge of the large-width slot 63b of the frame bottom plate 61. Concurrently, the clamp cam plate 68 is applied with a leftward force, and is pressed against the left bent guide 70 of the slide plate 67, which causes, in turn, the slide plate 67 to be pushed against the cut-and-bent guide lug 61c and the bent guide 62c at the left-hand side with respect to the longitudinal center line of the manually operated structure 64. As a result, the push-button plate 65, the clamp cam plate 68, and the slide plate 67 are restricted in their positions in the sidewise direction. These components are restricted at the same position every time the manually operated structure 64 is pushed to its innermost position. Therefore, the danger of any possible undesirable displacement of the memory member 72 as a result of repeated pushings is eliminated, thus ensuring that preset and reset tuning can be carried out with high accuracy.

When pushing of the push-button 66 is discontinued, the manually operated structure 64 slides back in the direction indicated by arrow H and assumes a state wherein the slide plate 67 makes engagement with the pair of pins 61b and the parallel edge 69a of the hole 69 in the push-button plate 65 engages with the pin 76, as indicated in FIG. 22. In conjunction with motion of the manually operated structure 64, the lug 75b of the rotation piece 75 shifts out of the straight edge 89c to the slope edge 89b of the cam window 89 and the clutch lever plate 88 which is continuously urged to slide in the direction of arrow A in FIG. 21 thereby slides back in the direction of arrow A to the original position indicated in FIG. 22. The arm 94 is in turn rotated counter-clockwise in FIG. 16 by the spring 109 until the roller 101 is brought into pressing contact with the drum part 95a, thus connecting the clutch mechanism.

Next, the operation for returning will be described. For sake of explanation, it is assumed that, prior to retuning operation, the cam plate 83 has been left in an arbitrary position indicated by the two-dot chain line in FIG. 22, and another station has been tuned in. For returning, the push-button 66 is pushed. Responsive to this pushing operation, the manually operated structure 64 operates in the same manner as in the preceding preset tuning operation, except that during its movement the rotation piece 75 is restricted in its angular position to that indicated in FIG. 22. Accordingly, the lug 75b of the rotation piece 75 makes contact with the sloped edge 89b of the cam window 89, thus causing the clutch lever plate 88 to slide in the direction of arrow B. Therefore, the mechanical connection between the cam plate 83 and the manual tuning mechanism is disconnected, and the cam plate 83 becomes slidable under small load, similarly as in the preceding preset tuning operation.

Responsive to further pushing operation of the push-button 66, the clamped memory member 72 makes contact with the V-shaped cam part 84 of the cam plate 83. Firstly the engagement part 72b at the left-hand side makes contact with the left cam surface 84b thus causing the cam plate 83 to slide in the direction of arrow A until the opposite cam surface 84a is brought into contact with the approaching engagement part 72a at the right-hand side. Accordingly, the cam plate 83 reaches the position indicated in FIG. 21, which position is the same as that at the time of preset tuning.

When the manually operated structure 64 reaches its innermost position, the push-button plate 65, and the clamp cam plate 68 and the slide plate 67 are respectively restricted in the sideward in mutually opposite directions due to the action of the pin 76 and the sloped edge 69b, similarly as in the preceding preset tuning operation. This ensures that the memory member 72 and the cam plate 83 are respectively positioned at exactly the same position as that at the tie time of preset operation.

When pushing is discontinued, the manually operated structure 64 and the clutch lever plate 88 slide back to their original positions indicated in FIG. 22. The roller 101 is brought into pressing contact with the drum part 95a. Thus, retuning is completed.

When the push-button 66 is pulled in the direction of arrow H in FIG. 22, the push-button plate 65 and the clamp cam plate 68 slide in the same direction with respect to the restricted slide plate 67 until the pin 81 makes contact with the front side edge of the slot 67g, as indicated in FIG. 19. Responsive to this operation, the pair of legs 71c move toward the opening of the taper cut 68a, in relative motion with respect to the clamping plate, up to the original position where they engage with the steps 68b. Accordingly, the clamp spring 71 is resiliently restored to increase the diameter of the ring part 71a, whereby the memory member 72 is set free from the clamped state and is rendered rotatable. The rotation piece 75 turns clockwise with its lever part 75a being caught by the engagement cut 70b until the lug 75b comes to confront the recessed edge 89a of the cam window 89.

In this state, the tuning knob is operated to tune in another station, and then the push-button 66 is pushed to preset the newly tuned-in station, in exactly the same manner as in the above described preset tuning operation.

In the present embodiment, since the pin 76 is merely loosely entered into the hole 69 it becomes possible to eliminate the work of caulking the lower end of the pin 76, thus reducing the number of fabrication steps and, moreover, facilitating disassembly for servicing and maintenance.

Also, since substantially the entire periphery of the memory member 72 is surrounded by the ring part 71a of the clamp spring 71, the memory member 72 rotates and is clamped stably, thus ensuring high tuning accuracy. Furthermore, since the clamp spring 71 is disposed in the horizontal plane and each leg 71c undergoes displacement in the same horizontal plane, the apparatus can be constructed with small thickness.

Furthermore, when positioning the cam plate 83, the engagement parts 72a and 72b of the memory member 72 respectively make concurrent engagement with the associated cam surfaces 84a and 84b of the cam plate 83. Accordingly, the cam plate 83 is positioned not under the application of a large force only in one direction but under the application of a pair of forces in the direction of the arrows A and B. As these forces substantially offset each other, much stable positioning of the cam plate 82 and much higher tuning accuracy is assured. Instead of the pair of engagement parts 72a and 72b of the memory member 72, a structure comprising a pair of pins may be adopted.

The push-button 66 undergoes sliding motion while being guided by the guide extension 62. This construction assures stable sliding operation of the manually operated structure 64, even if the push-button 66 is subjected to the force in a direction other than the pushing direction, and thus gives improved tuning accuracy. A modification may be made in the above described first embodiment of the present invention so that the push-button 25 is guided at its guide part by a guide extension of the frame bottom plate 11, similar to the third embodiment of the present invention.

Furthermore, the clutch mechanism 92 is designed not to require a clutch plate for engaging and disengaging or the like, which simplifies and miniaturizes the structure.

Still further, since the pair of legs 71c of the clamp spring 71 undergo rotational displacement concurrently, the memory member 72 can be clamped with greater stability than is possible with the structure of the first and second embodiments where only a single clamp arm part (32 or 46) undergoes rotational displacement. The concurrent rotational displacement of the pair of leg 71c can be achieved through the provision of slide plate 67, which is adapted to serve function of guiding the operated structure 64 in the directions of arrow G and H.

Alternatively, the rotation piece 75 may be rotatably supported on the slide plate 67 so as to be restrained in its angular position by the clamp cam plate 68. Moreover, a mechanism for restricting the position of the push-button plate 65 and the clamp cam plate 68 in their sideward directions may be constructed by having a pin fixed to the push-button plate 65 enter into the hole in the clamp cam plate 68.

Further, this invention is not limited to these embodiments but various variations and modifications may be made without departing from the scope of the invention.

What is claimed is:

1. A push-button type tuner apparatus, comprising:
   (a) a plurality of manually operated means extending in backward and forward directions with respect to a frame structure and successively arranged in a mutually parallel manner in transverse directions, so that front end parts thereof respectively extend and project frontwards with respect to the frame structure and each of the front end parts are respectively mounted with a push-button, each of said manually operated means being freely slidable in the backward and forward directions and having a memory member for memorizing a frequency, capable of rotating about an axis perpendicular with respect to the upper surface of said manually operated means, and clamp means for clamping said memory member at a predetermined angular position;
   (b) slide cam means arranged and provided freely slidable in a direction transverse said manually operated means and having a substantially V-shaped cam part, said slide cam means being slid appropriately by associated cam surfaces of said V-shaped cam part when engaged by said memory member moving in the forward direction;
   (c) a tuner whose frequency of reception varies in response to the sliding of said slide cam means;
   (d) a part of said clamp means of the manually operated means being of a two-arm structure having a slot formed between a pair of arms, having a support part provided at an innermost part of said slot, the inner diameter of said support part being varied by varying the distance between said pair of arms;
   (e) said push-button having an opening, and being relatively slidable in the backward and forward directions accommodating free ends of said arms within said opening with respect to said free ends of said arms, and said push-button being unitarily formed with a clamp cam part on at least one side of both inner sides making sliding contact with both outer sides of the free ends of said arms of said opening, for making contact with at least one arm of said arms and resiliently deforming said one arm towards a direction so as to close upon the other arm, said clamp cam part being an inclined cam surface inclined with respect to the sliding direction of said push-button; and
   (f) said memory member having a boss projecting in a perpendicular direction with respect to the upper surface of said manually operated means, said boss being rotatably supported by the support part of said clamp means, said one arm being rotationally displaced towards a direction to close upon said other arm in response to the relative sliding of said push-button, said memory member being prevented from rotating by the holding of said boss by both said arms.

2. A push-button type tuner apparatus as claimed in claim 1, wherein said clamp means further has a guide part formed unitarily therewith, and said clamp means is freely slidable in the backward and forward directions in a state where said guide part and the other arm are respectively guided by said frame structure.

3. A push-button type tuner apparatus comprising:
(a) a plurality of manually operated means extending in backward and forward directions with respect to a frame structure and successively arranged in a mutually parallel manner in transverse directions, so that front end parts thereof respectively extend and project frontwards with respect to the frame structure and each of the front end parts are respectively mounted with a push-button, each of said manually operated means being freely slidable in the backward and forward directions and having a memory member for memorizing a frequency, capable of rotating about an axis perpendicular with respect to the upper surface of said manually operated means, and clamp means for clamping said memory member at a predetermined angular position;
(b) slide cam means arranged and provided freely slidable in a direction crossing said manually operated means and having a substantially V-shaped cam part, said slide cam means being slid appropriately by associated cam surfaces of said V-shaped cam part and said memory member moving in the backward and forward directions respectively operating together;
(c) a tuner operated by the sliding of said slide cam means;
(d) a part of said clamp means of the manually operated means being of a two-arm structure having a slot formed between a pair of arms, and having a substantially cylindrical projection provided at an innermost part of said slot, outer diameter of said projection being varied by varying the distance between said pair of arms;
(e) said push-button having openings, and being relatively slidable in the backward and forward directions accommodating free ends of said arms within said openings with respect to said free ends of said arms, and said opening being unitarily formed therein with a clamp cam part entering between both said arms during the above relative sliding of said push-button and resiliently deforming at least one arm with respect to the other arm to vary the effective outer diameter of said projection, said clamp cam part being an inclined surface inclined with respect to the sliding direction of said push-button; and
(f) said memory member having a hole rotationally fitted over the outer peripheral surface of said projection, said one arm being rotationally displaced to separate from the other arm in response to the relative sliding of said push-button to increase the effective outer diameter of said projection, said memory member being prevented of rotation by pressing said projection against the inner peripheral surface of said hole.

4. A push-button type tuner apparatus comprising:
(a) a plurality of manually operated means extending in backward and forward directions with respect to a frame structure and successively arranged in a mutually parallel manner in transverse directions, so that front ends parts thereof respectively extend and project frontwards with respect to the frame structure and each of the front end parts are respectively mounted with a push-button, each of said manually operated means being freely slidable in the backward and forward directions and having a memory member for memorizing a frequency, capable of rotating about an axis perpendicular with respect to the upper surface of said manually operated means, and clamp means for clamping said memory member at a predetermined angular position;
(b) slide cam means arranged and provided freely slidable in a direction crossing said manually operated means and having a substantially V-shaped cam part, said slide cam means being slid appropriately by associated cam surfaces of said V-shaped cam part and said memory member moving in the backward and forward directions respectively operating together;
(c) a tuner operated by the sliding of said slide cam means;
(d) a part of said clamp means of the manually operated means being of a two-arm structure having a slot formed between a pair of arms, provided with an engaging depression at the front end of one arm, and having a support part provided at an innermost part of said slot, inner diameter of said support part being varied by varying the distance between said pair of arms;
(e) said push-button having an opening, and being relatively slidable in the backward and forward directions accommodating free ends of said arms within said opening with respect to said free ends of said arms, and said push-button being unitarily formed with a clamp cam part on at least one side of both inner sides making sliding contact with both outer sides of the free ends of said arms of said opening, for making contact with at least one arm of said arms and resiliently deforming said one arm towards a direction so as to close upon the other arm, said clamp cam part being an inclined cam surface inclined with respect to the sliding direction of said push-button, said relative sliding of said push-button being determined of the sliding limit in the frontward direction by the contact between a fixed pin and the engaging depression;
(f) said memory member having a boss projecting in a perpendicular direction with respect to the upper surface of said manually operated means, said boss being rotatably supported by the support part of said clamp means, said one arm being rotationally displaced towards a direction to close upon said other arm in response to the relative sliding of said push-button, said memory member being prevented of rotation by the holding of said boss by both said arms; and
(g) said slide cam means being unitarily formed with a guide pin part in the vicinity of the tip ends of the associated cam surfaces of the V-shaped cam part in a projecting manner, said guide pin part being fitted over with a U-shaped free end of a substantially U-shaped guide lever axially supported in a freely rotatable manner by a shaft part in the vicinity of said slide cam means of said frame structure so that the outer side surface of said guide lever construct an extension of the associated cam surfaces of said V-shaped cam part.

5. A push-button type tuner apparatus comprising:
(a) a plurality of manually operated means extending in backward and forward directions with respect to a frame structure and successively arranged in a mutually parallel manner in transverse directions, so that front end parts thereof respectively extend and project frontwards with respect to the frame structure and each of the front end parts are respectively mounted with a push-button, each of said manually operated means being freely slidable in the backward and forward directions and having a memory member for memorizing a frequency, capable of rotating about an axis perpendicular with respect to the upper surface of said manually operated means, and clamp means for clamping said memory member at a predetermined angular position;
(b) slide cam means arranged and provided freely slidable in a direction crossing said manually operated means and having a substantially V-shaped cam part, said slide cam means being slid appropriately by associated cam surfaces of said V-shaped cam part and said memory member moving in the backward and forward directions respectively operating together;
(c) a tuner operated by the sliding of said slide cam means;
(d) a part of said clamp means of the manually operated means being of a two-arm structure having a slot formed between a pair of arms, provided with an engaging depression at the front end of one arm, and having a substantially cylindrical projection provided at an innermost part of said slot, outer diameter of said projection being varied by varying the distance between said pair of arms;
(e) said push-button having openings and a fixed pin, and being relatively slidable in the backward and forward directions accommodating free ends of said arms within said openings with respect to said free ends of said arms, and said opening being unitarily formed therein with a clamp cam part entering between both said arms during the above relative sliding of said push-button and resiliently deforming at least one arm with respect to the other arm to vary the effective outer diameter of said projection, said clamp cam part being an inclined surface inclined with respect to the sliding direction of said push-button, said relative sliding of said push-button being determined of the sliding limit in the forward direction by the contact between said fixed pin and engaging depression;
(f) said memory member having a hole rotationally fitted over the outer peripheral surface of said projection, said one arm being rotationally displaced to separate from the other arm in response to the relative sliding of said push-button to increase the effective outer diameter of said projection, said memory member being prevented of rotation by pressing said projection against the inner peripheral surface of said hole;
(g) said slide cam means being unitarily formed with a guide pin part in the vicinity of the tip ends of the associated cam surfaces of the V-shaped cam part in a projecting manner, said guide pin part being fitted over with a U-shaped free end of a substantially U-shaped guide lever axially supported in a freely rotatable manner by a shaft part in the vicinity of said slide cam means of said frame structure so that the outer side surface of said guide lever construct an extension of the associated cam surfaces of said V-shaped cam part.

6. A push-button type tuner apparatus comprising:
(a) a plurality of manually operated means extending in backward and forward directions with respect to a frame structure and successively arranged in a mutually parallel manner in right and left directions, each of said manually operated means having sliding means freely slidable in the backward and forward directions, a memory member for memorizing a frequency, capable of rotating about an axis perpendicular with respect to the upper surface of said sliding means, clamp means for clamping said memory member at a predetermined angular position, and push-button plate means mounted relatively and freely slidable with respect to said sliding means and having a front end part projecting frontwards with respect to said frame structure, said push-button plate means being mounted with a push-button at the projecting part thereof;
(b) slide cam means arranged and provided freely slidable in a direction crossing said manually operated means and having a substantially V-shaped cam part, said slide cam means being slid appropriately by associated cam surfaces of said V-shaped cam part and said memory member moving in the backward and forward directions respectively operating together;
(c) a tuner operated by the sliding of said slide cam means;
(d) a clutch plate provided freely slidable in the above crossing direction so as to interrupt the connection of a manual tuning shaft and said slide cam means by linking with the movement of said manually operated means and sliding;
(e) said clamp means of the manually operated means being of a two-arm structure having a pair of arms, and having a support part provided at an innermost part of said two-arm structure, inner diameter of said support part being varied by varying the distance between said pair of arms;
(f) said push-button plate means further having clamp cam means for operating said pair of arms of said clamp means, and a freely rotatable rotation piece for sliding and driving said clutch plate;
(g) one end engaging projection of said rotation piece always engaging with an engaging depression of said sliding means, and the other end engaging projection corresponding to cam depressions of said clutch plate;
(h) said memory member being axially supported in a freely rotatable manner by the support part of said clamp means, said pair of arms being rotationally displaced towards directions so as to mutually close upon each other in response to the relative sliding of said push-button plate means, said memory member being prevented of rotation by the holding of said memory member by said arms; and
(i) said clutch plate beginning a sliding movement when said rotation piece begins rotating and said end engaging projection makes contact with said cam depression during the relative sliding of said push-button plate means, to interrupt the connection of said manual tuning shaft and said slide cam means when the operation to prevent said memory member from rotating is completed for approximately one-half the full operation.

7. A push-button type tuner apparatus as claimed in claim 6 wherein said clamp cam means and said push-button plate means are arranged and provided opposing each other and having said sliding means therebetween, and a projection unitarily formed on at least one of the clamp cam means and the push-button plate means said projection passing through a relatively large opening in the sliding means and further loosely entering into a relatively small hole in the other means.

8. a push-button type tuner apparatus as claimed in claim 7 wherein the clamp cam means and the sliding means are provided with a guide mechanism for causing the clamp cam means to slide backwards and forwards without play in the transverse direction, and the relatively small hole has a sloped edge which inclines at a specific angle with respect to the transverse direction, the sloped edge being brought into pressing contact with the projection when the push-button plate means reaches its inwardmost position.

9. A push-button type tuner apparatus as claimed in claim 7 wherein the push-button plate means is disposed inside a guide slot formed in a bottom plate of the frame structure at the same height position as the bottom plate part and is slidable backwards and forwards under guidance by the guide slot.

10. A push-button type tuner apparatus as claimed in claim 6 wherein the memory member has a pair of engagement parts which are brought into concurrent contact with respective associated cam surfaces of the V-shaped cam part in the sliding cam means.

11. A push-button type tuner apparatus as claimed in claim 6 wherein the push-button has a guide part formed therein and the frame structure is provided with a projection bead guide formed unitarily therewith at the front side thereof, the push-button being slidable backwards and forwards with the guide part being guided by the projection bead guide.

12. A push-button type tuner apparatus as claimed in claim 11, wherein a coil spring for urging said manually operated means towards the frontward direction is fitted over said projection bead guide, between the front part of said frame structure and said push-button.

13. A push-button type tuner apparatus as claimed in claim 12 wherein said projection bead guide and said coil spring respectively have cross sections of substantially flat rectangular shape.

* * * * *